(12) United States Patent
Chen et al.

(10) Patent No.: US 7,482,682 B2
(45) Date of Patent: Jan. 27, 2009

(54) MICRO-DEVICE PACKAGING

(75) Inventors: Chien-Hua Chen, Corvallis, OR (US);
Henry Kang, Corvallis, OR (US);
Bradley Charles John, Sheridan, OR (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 374 days.

(21) Appl. No.: 11/105,234

(22) Filed: Apr. 12, 2005

(65) Prior Publication Data

US 2006/0226524 A1    Oct. 12, 2006

(51) Int. Cl.
*H01L 23/02* (2006.01)

(52) U.S. Cl. .............................. 257/680; 257/E23.193

(58) Field of Classification Search .................. 257/678, 257/684, 794, 680, 687, E23.128, E23.183, 257/E23.193
See application file for complete search history.

(56) References Cited

U.S. PATENT DOCUMENTS

| 6,955,934 B2* | 10/2005 | Gallup et al. ................. 438/27 |
| 2003/0170966 A1* | 9/2003 | Lutz ............................ 438/456 |
| 2006/0082737 A1* | 4/2006 | Sterner et al. ............... 353/102 |

* cited by examiner

*Primary Examiner*—Brook Kebede

(57) ABSTRACT

In one embodiment, a package for a micro-device includes a substrate, a transparent material covering the substrate, and a bond ring bonding the transparent material to the substrate. The bond ring comprises a silicon oxide layer on one of the substrate or the transparent material bonded to a silicon layer on the other of the substrate or the transparent material.

31 Claims, 9 Drawing Sheets

MICRO-DEVICE PACKAGING

BACKGROUND

Microelectromechanical system (MEMS) devices are used to modulate the display of color and light in digital projectors and other optical devices. Optical MEMS devices are often formed on a silicon substrate using semiconductor processing techniques and then sealed under a glass cover that allows light to reach the MEMS device. In one type of optical MEMS package, a thermally grown or deposited silicon oxide layer on the bottom of the glass cover bonds to a thermally grown or deposited silicon oxide membrane formed over the MEMS device to affix the cover to the underlying structure. The silicon oxide to silicon oxide bond is transparent but may not be strong enough for some applications. It may be desirable in some optical MEMS packages, therefore, to increase the strength of the cover-to-membrane bond while still allowing light to reach the MEMS device.

DRAWINGS

DESCRIPTION

Embodiments of the present invention were developed in an effort to improve the strength of cover bonds in optical MEMS packages. Exemplary embodiments of the invention will be described, therefore, with reference to packaging an optical MEMS device. Embodiments of the invention, however, are not limited to optical MEMS packages but may be used in any application or environment which might benefit from the new bonding structures and techniques. Hence, the following description should not be construed to limit the scope of the invention, which is defined in the claims that follow the description.

Figure 1:
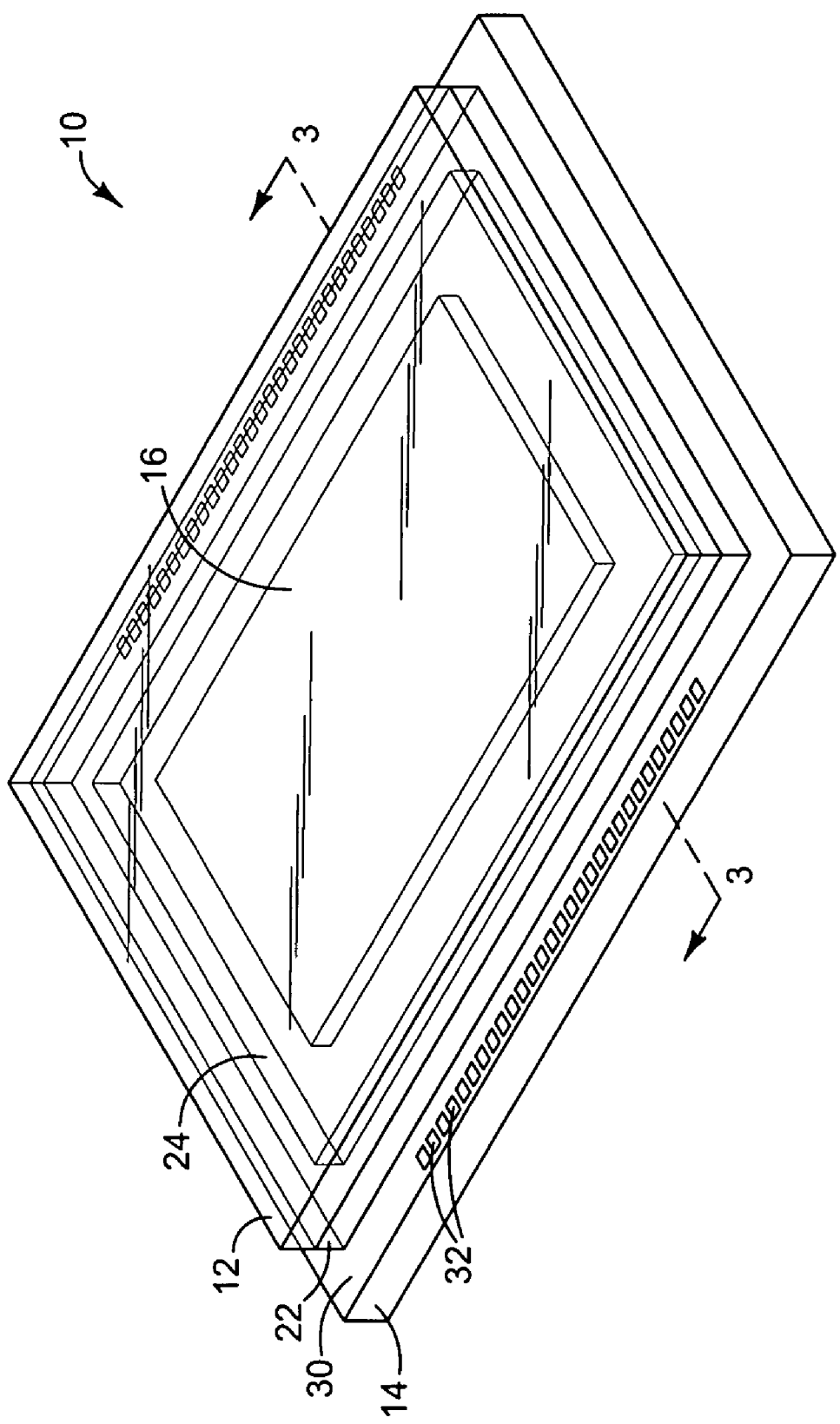
FIGS. 1 and 2 are perspective and plan views, respectively, illustrating a micro-device package that may be assembled using "pick and place" packaging techniques.
Figure 2:
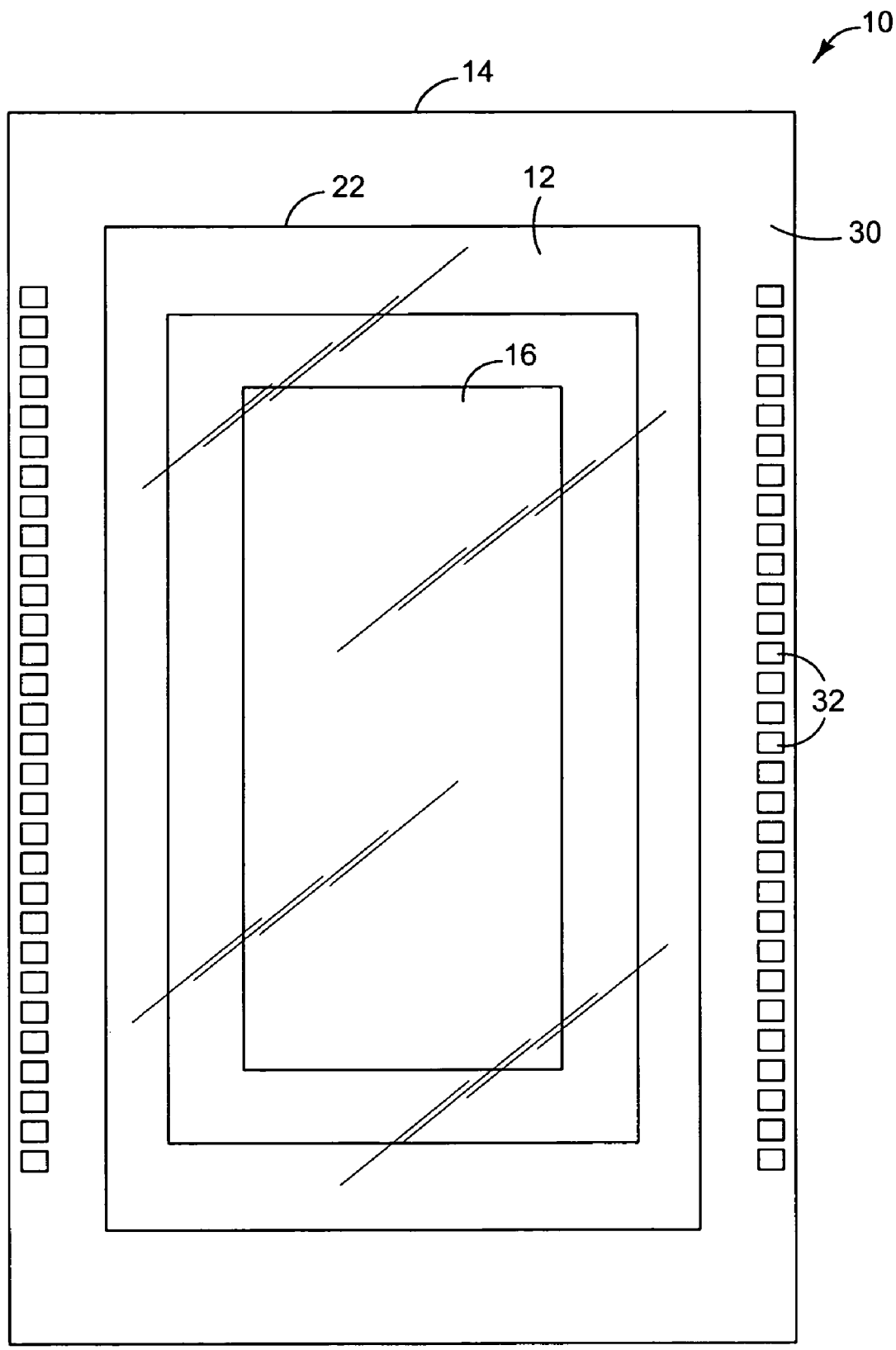
Figure 3:
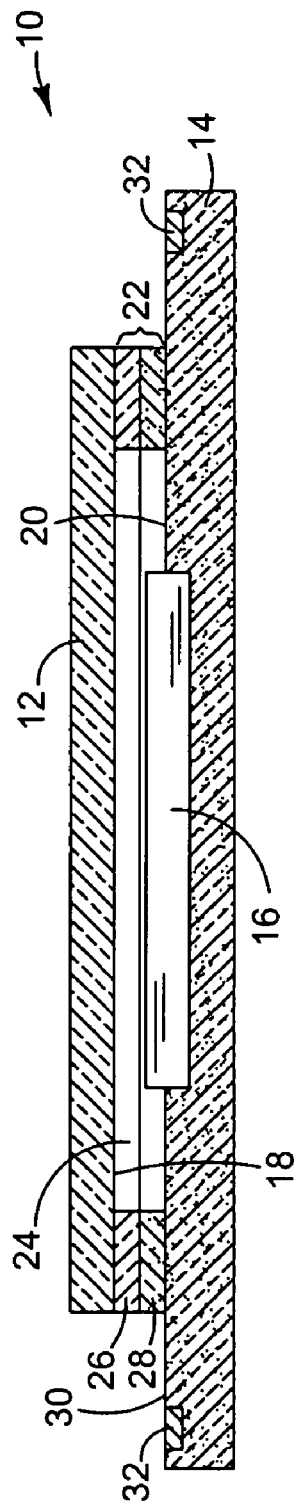
FIG. 3 is a section view taken along the lines 3-3 in FIG. 1 illustrating one example of a micro-device package.

FIGS. 1 and 2 illustrate a micro-device package 10 that may be assembled using "pick and place" packaging techniques. FIG. 3 is a section view illustrating the package of FIG. 1. (The section view of FIG. 3 also illustrates the package of FIG. 6, discussed below.) Referring to FIGS. 1-3, device package 10 includes a transparent cover 12, a substrate 14 and one or more micro-devices formed on substrate 14. The micro-devices are depicted generally by an area 16 on substrate 14. Micro-devices 16 represent generally one or more optical MEMS devices or other small optical, electrical, mechanical or electromechanical structures and devices. "Transparent" as used in this document means the property of transmitting electromagnetic radiation along at least that part of the spectrum that includes wavelengths of infrared, visible or ultra-violet light. For example, for a micro-device 16 used to modulate color in a digital projector, cover 12 will be transparent at least to visible light but need not be transparent to infrared and ultraviolet light. In another example, for a micro-device 16 used to generate or modulate light in an infrared laser, cover 12 will be transparent at least to infrared light but need not be transparent to visible and ultraviolet light.

As best seen in FIG. 3, a primary surface 18 on cover 12 is attached to a primary surface 20 on substrate 14 by a bond ring 22 that surrounds micro-devices 16. Micro-devices 16 are enclosed within a cavity 24 defined by cover 12, substrate 14 and bond ring 22. Bond ring 22 includes a silicon oxide layer 26 on one of the cover surface 18 (shown) or the substrate surface 20 and a silicon layer 28 on the other of the substrate surface 20 (shown) or the cover surface 18. Cover 12 does not cover all of substrate 14, leaving a periphery 30 of substrate 14 exposed. Electrical contact pads 32 are positioned along exposed periphery 30 of substrate 14 for making electrical contact to micro-devices 16 through a circuit structure (not shown) integrated into substrate 14.

Figure 4:
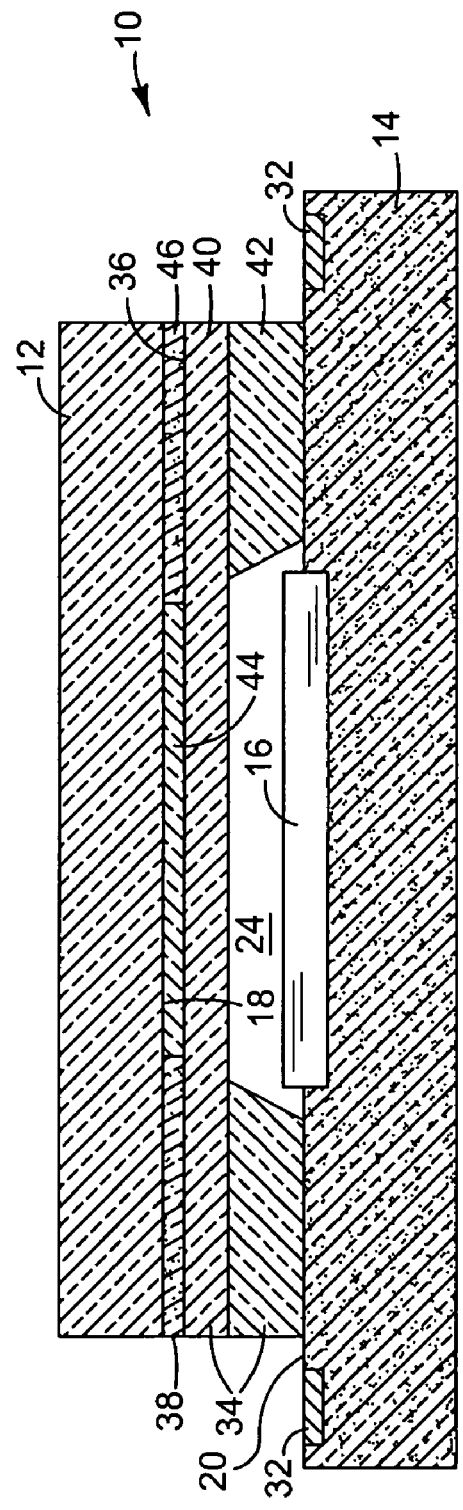
FIG. 4 is a section view illustrating another example of a micro-device package.

In another embodiment of a micro-device package 10, illustrated in FIG. 4, a separator 34 made from silicon oxide, silicon oxynitride, indium tin oxide (ITO) or another suitable transparent material is formed on substrate surface 20 over micro-devices 16. Cover surface 18 is bonded to a primary surface 36 of separator 34 through a bonding layer 38. In this embodiment, cavity 24 is defined by substrate 14 and separator 34. Separator 34 may be formed in two parts, a cover part 40 formed on a base part 42 as shown in FIG. 4, or as a single part. Bonding layer 38 includes an inner transparent part 44 positioned over micro-devices 16 and an outer part 46 surrounding inner transparent part 44. A transparent inner part 44, made from silicon oxide or another suitable transparent bonding material for example, provides optical clarity at the viewing area over micro-devices 16 but a weaker bond, while a silicon outer part 46, for example, is opaque but provides a stronger bond outside the viewing area over micro-devices 16. Although a silicon outer part 46 formed using amorphous silicon or polysilicon is shown, any suitable bonding material that offers increased bond strength may be used for outer part 46.

Figure 5:
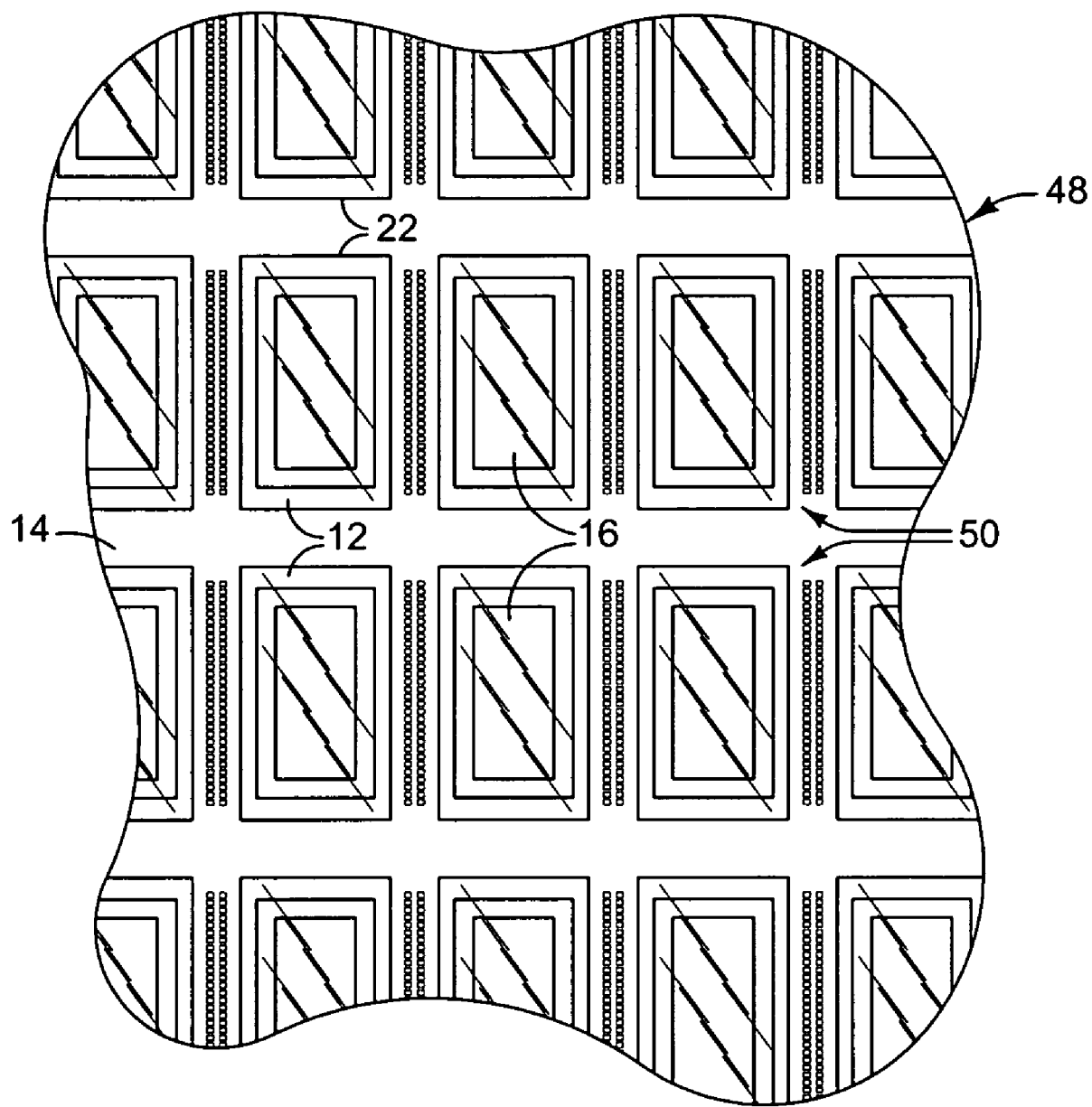
FIG. 5 is a plan view illustrating a portion of a wafer on which micro-device packages such as the ones shown in FIGS. 14 are assembled.

FIG. 5 is a plan view illustrating a portion of a wafer 48 on which micro-device packages 10 are assembled using a "pick and place" assembly technique. A silicon wafer 48, for example, forms the substrate 14 for each device package 10. Referring to FIG. 5, multiple arrays of micro-devices 16 are formed at die locations 50 on wafer 48. Each array of micro-devices 16 is formed on wafer 48 at a die location 50 configured to form individual dies when singulated from wafer 48. Each individual cover 12 is "picked" and then "placed" over an array of micro-devices 16 at a die location 50 and bonded to wafer 48 with a bond ring 22 (shown) or bonding layer 38, as described above.

Figure 6:
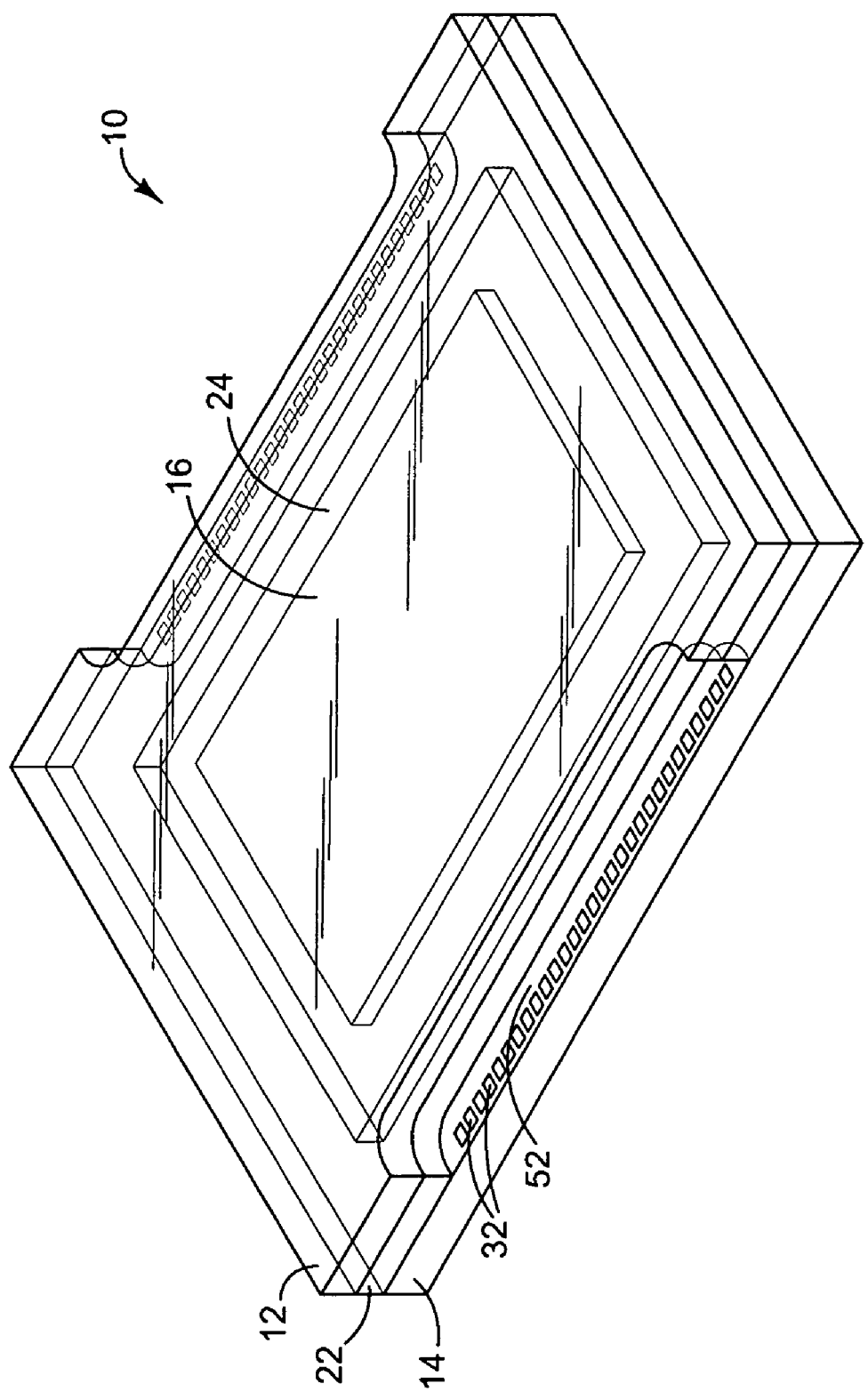
FIG. 6 is a perspective view illustrating a micro-device package that may be assembled using "wafer scale" packaging techniques.
Figure 7:
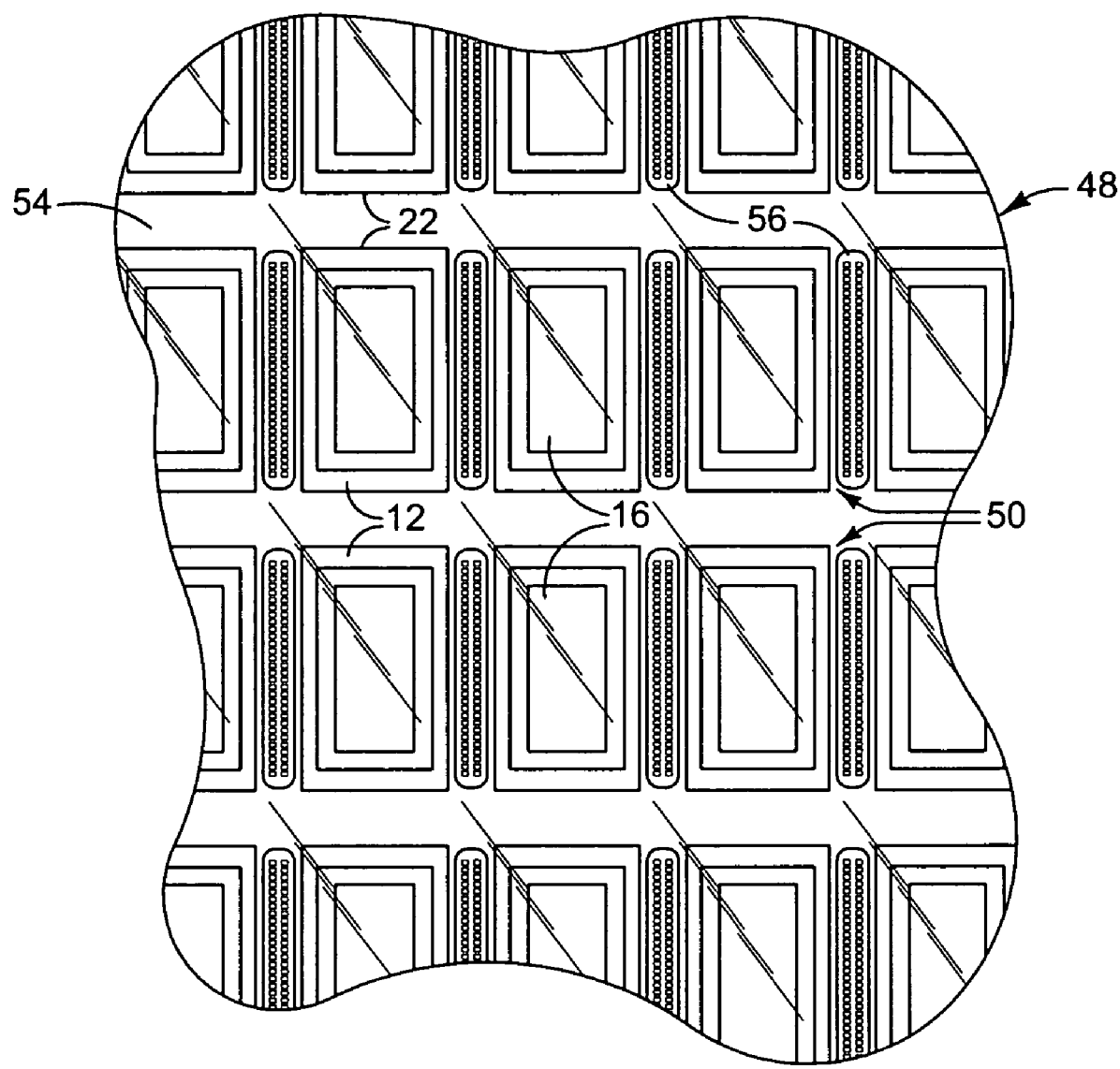
FIG. 7 is a plan view illustrating a portion of a wafer on which micro-device packages such as the one shown in FIG. 6 are assembled.

FIG. 6 is a perspective view illustrating a micro-device package 10 that may be assembled using "wafer scale" packaging techniques. In the package 10 shown in FIG. 6, cover 12 extends to the sides of substrate 14 except at the exposed areas 52 of substrate 14 surrounding contact pads 32. FIG. 7 is a plan view illustrating the assembly of micro-device packages 10 using a "wafer scale" assembly technique. Referring to FIG. 7, multiple arrays of micro-devices 16 are formed at die locations 50 on wafer 48. Each array of micro-devices 16 is formed on wafer 48 at a die location 50 configured to form individual dies when singulated from wafer 48. A transparent cover wafer 54 with openings 56 is bonded to wafer 48 with bond rings 22 (shown) or bonding layers 38. Each opening 56 is formed in transparent wafer 54 at a location corresponding to the location of adjacent rows of contact pads 32 on substrate wafer 48. Each die is singulated from substrate wafer 48 to form a device package 10 such as the one shown in FIG. 6.

Figure 8:
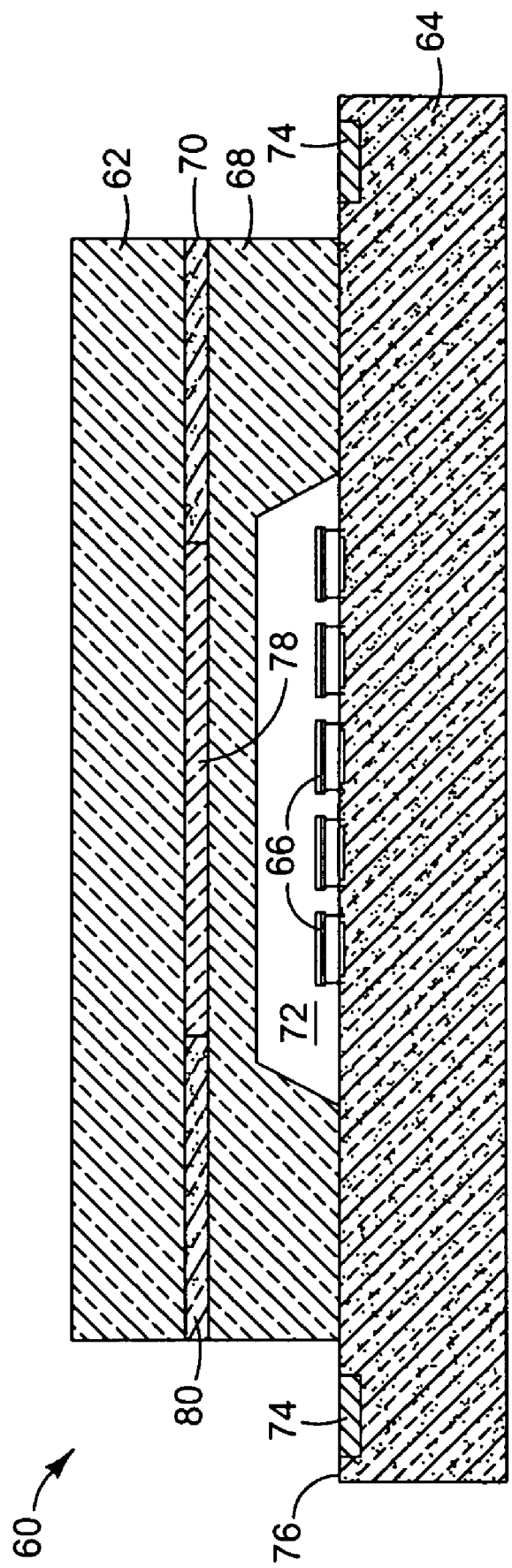
FIG. 8 is a section view illustrating an optical MEMS device package.

FIG. 8 is a section view illustrating an optical MEMS device package 60. FIGS. 9-12 are section views illustrating a sequence of process steps for assembling a MEMS device package such as package 60 shown in FIG. 8. Referring first to FIG. 8, device package 60 includes a glass or other transparent cover 62, a substrate 64 and an array of optical MEMS devices 66 formed on substrate 64. A silicon oxide separator 68 is formed on substrate 64 over micro-devices 66. Separator 68 is sometimes referred to in the art as a silicon oxide membrane. Cover 62 is bonded to separator 68 through a bonding layer 70. Devices 66 are enclosed within a cavity 72 defined by substrate 64 and separator 68. Electrical contact pads 74 are positioned along exposed periphery 76 of substrate 64 for making electrical contact to micro-devices 66 through a circuit structure (not shown) integrated into substrate 64.

Bonding layer 70 includes an inner transparent part 78 positioned over micro-devices 66 and an outer part 80 surrounding inner transparent part 78. A transparent silicon oxide inner part 78, for example, provides optical clarity at the viewing area over micro-devices 66 but a weaker silicon oxide to silicon oxide bond, while a silicon outer part 80, for example, is opaque but provides a stronger silicon oxide to silicon bond outside the viewing area over micro-devices 66. A silicon outer part 80 may be formed using amorphous silicon or polysilicon.

Figure 9:
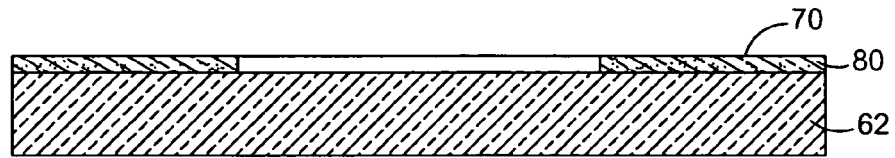
FIGS. 9-12 are section views illustrating a sequence of process steps for assembling the MEMS device package shown in FIG. 8.
Figure 10:
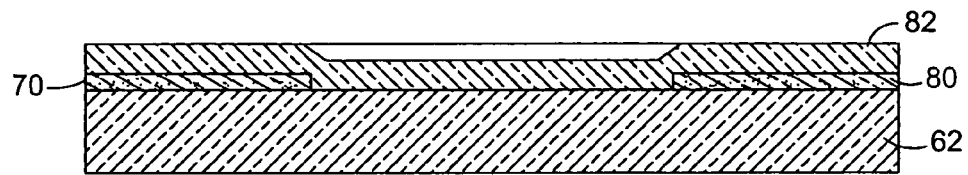
Figure 11:
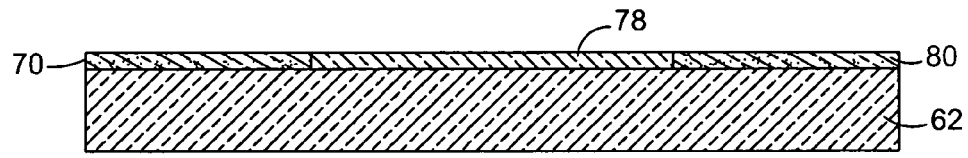
Figure 12:
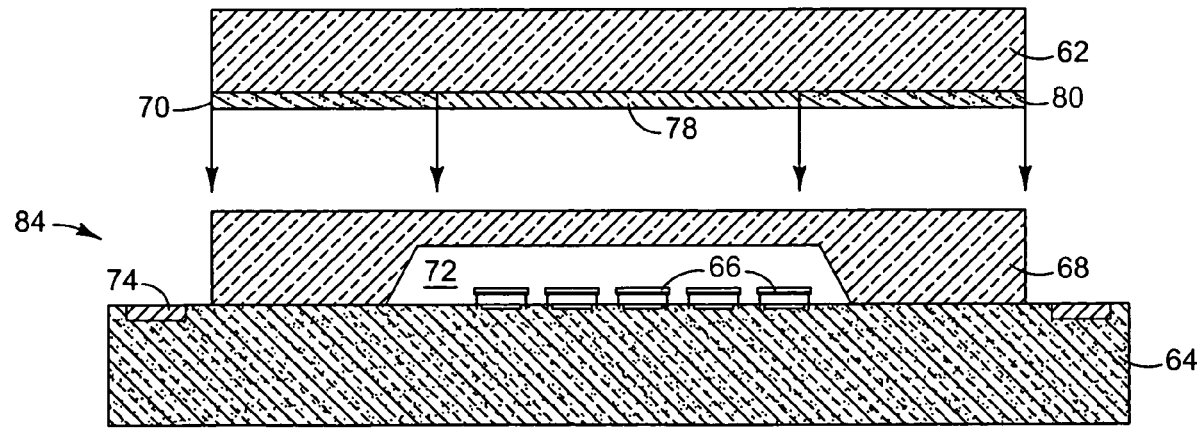

Referring now to FIG. 9, a silicon layer is formed on a glass substrate/cover 62 and patterned to form outer part 80 of bonding layer 70. Next, and referring to FIG. 10, a silicon oxide layer 82 is formed over the structure of FIG. 9. Silicon oxide layer 82 is removed down to the level of silicon outer part 80 to form the two-part bonding layer 70 shown in FIG. 11. While it is expected that this silicon oxide removal will usually be performed by chemical-mechanical polishing (CMP) or another suitable planarization technique, other removal techniques may be used. For example, excess silicon oxide may be removed by etching or a combination of etching followed by CMP planarization. The planarization may include silicon outer part 80 to help ensure a truly planar surface across the full width of bonding layer 70. Glass cover 62 is then positioned on silicon oxide separator 68 on a MEMS/substrate assembly 84, as shown in FIG. 12. Bonding layer 70 is "activated" to affix cover 62 to silicon oxide separator 68 by, for example, plasma treatment, bond and annealing process steps.

Figure 13:
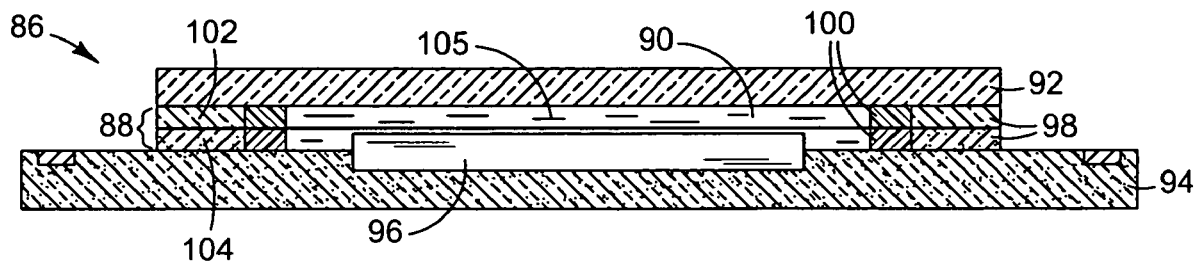
FIGS. 13 and 14 are section views illustrating other examples of a micro-device package.

In another embodiment of a micro-device package 86 illustrated in FIG. 13, a bond ring 88 surrounds a fluid filled cavity 90 such as might be used for biomedical devices. Referring to FIG. 13, device package 86 includes a cover 92, a substrate 94 and a micro-device 96 formed on substrate 94. Cover 92 is attached to substrate 94 by bond ring 88 that surrounds cavity 90. Micro-device 96 is enclosed within cavity 90. Bond ring 88 includes an outer part 98 and an inner part 100. Outer part 98 includes a silicon oxide layer 102 on one of the cover 92 (shown) or the substrate 94 and a silicon layer 104 on the other of the substrate 94 (shown) or the cover 92. Inner part 100 is formed from a material compatible with fluid 105 in cavity 90 to insulate fluid 105 from any contaminating effects of the outer bond ring materials. Inner part 100 may, for example, be formed from a layer of polydimethylsiloxane (PDMS) or other bio-compatible material formed on cover 92 and substrate 94.

Figure 14:
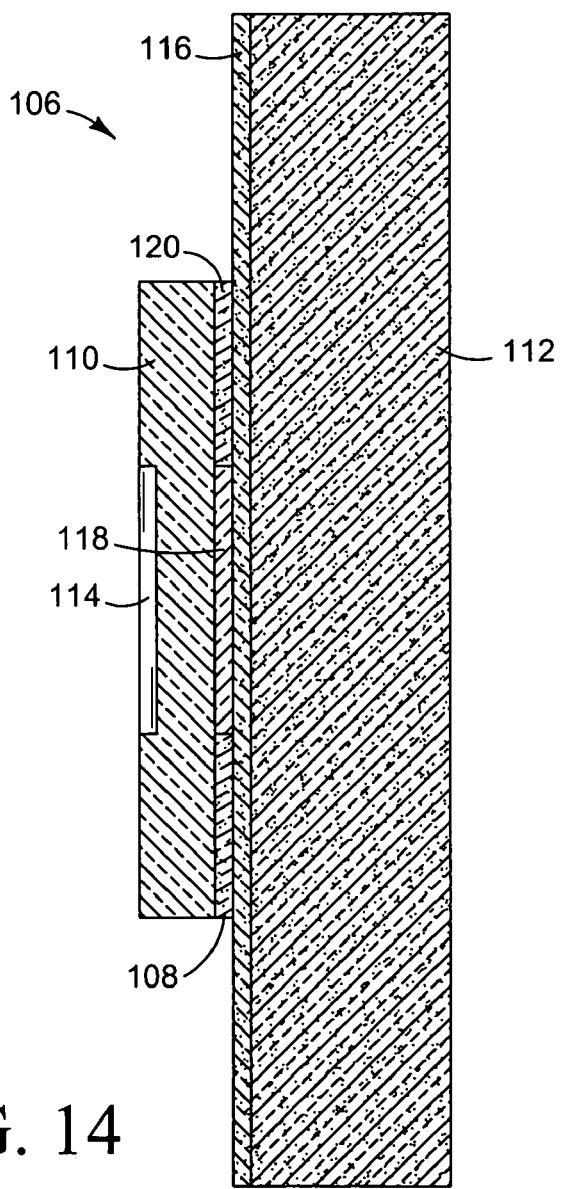

In another embodiment of a micro-device package 106 illustrated in FIG. 14, a two part bonding layer 108 is used to bond glass plates 110 and 112. Referring to FIG. 14, device package 106 includes one or more optical MEMS devices 114 embedded in or otherwise affixed to a glass faceplate 110. Faceplate 110 may be formed, for example, from so-called "LCD glass" commonly used in liquid crystal displays. Faceplate 110 is bonded to a glass cover 112 coated with a silicon oxide layer 116. Cover 112 may be formed, for example, from so-called "soft glass" commonly used for CRT assembly. Bonding layer 108 includes a transparent inner part 118 positioned behind MEMS 114 and an outer part 120 surrounding inner transparent part 118. A transparent silicon oxide inner part 118, for example, provides optical clarity at the viewing area over MEMS 114 but a weaker silicon oxide to silicon oxide bond, while a silicon outer part 120, for example, is opaque but provides a stronger silicon oxide to silicon bond outside the viewing area over MEMS 114.

As noted at the beginning of this Description, the exemplary embodiments shown in the figures and described above illustrate but do not limit the invention. Other forms, details, and embodiments may be made and implemented. Therefore, the foregoing description should not be construed to limit the scope of the invention, which is defined in the following claims.

What is claimed is:

1. A package for a micro-device, comprising: a substrate; a transparent material covering the substrate; and a bond ring bonding the transparent material to the substrate, the bond ring comprising: a silicon oxide layer on the substrate bonded to a silicon layer on the transparent material; or silicon oxide layer on the transparent material bonded to a silicon layer on the substrate.

2. The package of claim 1, wherein the silicon layer comprises an amorphous silicon layer or a polysilicon layer.

3. The package of claim 1, further comprising a cavity defined by the transparent material, the substrate and the bond ring.

4. The package of claim 3, further comprising a micro-device on the substrate within the cavity.

5. The package of claim 1, further comprising:
   a cavity defined by the transparent material, the substrate, and an inner ring formed from a bio-compatible material; and
   a micro-device on the substrate within the cavity, the inner ring surrounding the micro-device and the bond ring surrounding the inner ring.

6. The package of claim 1, wherein the substrate includes a first surface and a second surface, the bond ring bonding the transparent material to the first surface of the substrate, and the package further comprising a micro-device formed in the second surface of the substrate opposite the transparent material.

7. A package for a micro-device, comprising:
   a substrate;
   first transparent material over the substrate;
   second transparent material bonded to the first transparent material; and
   a bonding layer between the first transparent material and the second transparent material, the bonding layer including a first transparent part having a first bond strength when bonded to the first and second transparent materials and a second part surrounding the first transparent part, the second part having a second bond strength stronger than the first bond strength when bonded to the first and second transparent materials.

8. The package of claim 7, further comprising:
a cavity defined at least in part by the substrate and the first transparent material; and
a micro-device on the substrate within the cavity.

9. The package of claim 7, wherein the first transparent part of the bonding layer comprises silicon oxide and the second part of the bonding layer comprises silicon.

10. The package of claim 9, wherein the silicon comprises amorphous silicon or polysilicon layer.

11. . A package for a micro-device, comprising:
a substrate;
first transparent material over the substrate;
second transparent material bonded to the first transparent material; and
a bonding layer between the first transparent material and the second transparent material, the bonding layer including a first transparent part and a second opaque part surrounding the first transparent part.

12. The package of claim 11, further comprising:
a cavity defined at least in part by the substrate and the first transparent material; and
a micro-device on the substrate within the cavity.

13. The package of claim 11, wherein the first transparent part of the bonding layer comprises silicon oxide and the second opaque part of the bonding layer comprises silicon.

14. The package of claim 13, wherein the silicon comprises amorphous silicon or polysilicon.

15. A package for a micro-device, comprising:
a substrate;
an optical MEMS device on the substrate;
a separator comprising silicon oxide covering the MEMS device;
a transparent cover bonded to the separator; and
a bonding layer between the transparent cover and the separator, the bonding layer including a first part comprising silicon oxide at a location allowing the operative transmission of light to the MEMS device and a second part comprising silicon surrounding the first part.

16. The package of claim 15, further comprising a cavity defined by the substrate and the separator, the MEMS device on the substrate within the cavity.

17. A micro-device assembly, comprising: a substrate having a plurality of optical MEMS devices formed thereon at respective die locations; a plurality of transparent covers each covering a respective one of the MEMS devices; and a plurality of bond rings each bonding a cover to the substrate and each bond ring comprising: a silicon oxide layer on the substrate bonded to a silicon layer on the cover; or a silicon oxide layer on the cover bonded to a silicon layer on the substrate.

18. The assembly of claim 17, further comprising a plurality of cavities each defined by a cover, the substrate and a bond ring, and each MEMS device on the substrate within a cavity.

19. The assembly of claim 17, further comprising electrical contact pads arranged on exposed portions of the substrate at each die location.

20. A micro-device assembly, comprising: a substrate having a plurality of optical MEMS devices formed thereon at respective die locations; a transparent cover covering the MEMS devices, the cover having openings therein exposing a portion of the substrate adjacent to a MEMS device at each die location; and a plurality of bond rings each bonding the cover to the substrate and each bond ring comprising: a silicon oxide layer on the substrate bonded to a silicon layer on the cover; or a silicon oxide layer on the cover bonded to a silicon layer on the substrate.

21. The assembly of claim 20, further comprising a plurality of cavities each defined by a cover, the substrate and a bond ring, and each MEMS device on the substrate within a cavity.

22. The assembly of claim 20, further comprising electrical contact pads arranged on the exposed portions of the substrate at each die location.

23. A micro-device assembly, comprising:
a substrate having a plurality of optical MEMS devices formed thereon at respective die locations;
transparent material covering each MEMS device;
a plurality of cavities defined at least in part by the substrate and the transparent material covering each MEMS device and each MEMS device on the substrate within a cavity;
a plurality of transparent covers each bonded to the transparent material covering a respective one of the MEMS devices; and
a bonding layer between the transparent material and each cover, the bonding layer including a first transparent part having a first bond strength when bonded to the transparent material and a cover and a second part surrounding the first transparent part, the second part having a second bond strength stronger than the first bond strength when bonded to the transparent material and a cover.

24. The assembly of claim 23, wherein the first transparent part of each bonding layer comprises silicon oxide and the second part of each bonding layer comprises silicon.

25. The assembly of claim 23, further comprising electrical contact pads arranged on exposed portions of the substrate at each die location.

26. A micro-device assembly, comprising:
a substrate having a plurality of optical MEMS devices formed thereon at respective die locations;
transparent material covering each MEMS device;
a plurality of cavities defined at least in part by the substrate and the transparent material covering each MEMS device and each MEMS device on the substrate within a cavity;
a transparent cover bonded to the transparent material covering the MEMS devices, the cover having openings therein exposing a portion of the substrate adjacent to a MEMS device at each die location; and
a bonding layer between the transparent material and the cover, the bonding layer including a first transparent part having a first bond strength when bonded to the transparent material and the cover and a second part surrounding the first transparent part, the second part having a second bond strength stronger than the first bond strength when bonded to the transparent material and the cover.

27. The assembly of claim 26, wherein the first transparent part of each bonding layer comprises silicon oxide and the second part of each bonding layer comprises silicon.

28. The assembly of claim 26, further comprising electrical contact pads arranged on exposed portions of the substrate at each die location.

29. A cover for a micro-device package, comprising a transparent substrate and a bonding layer on the substrate, the bonding layer including a first transparent part and a second opaque part surrounding the first transparent part.

30. The cover of claim 29, wherein the first transparent part of the bonding layer comprises silicon oxide and the second opaque part of the bonding layer comprises silicon.

31. The cover of claim 30, wherein the silicon comprises amorphous silicon or polysilicon.

* * * * *

UNITED STATES PATENT AND TRADEMARK OFFICE
CERTIFICATE OF CORRECTION

PATENT NO.       : 7,482,682 B2
APPLICATION NO.  : 11/105234
DATED            : January 27, 2009
INVENTOR(S)      : Chien-Hua Chen et al.

Page 1 of 1

It is certified that error appears in the above-identified patent and that said Letters Patent is hereby corrected as shown below:

In column 1, line 32, delete "FIGS. 14" and insert -- FIGS. 1-4 --, therefor.

In column 5, line 14, in Claim 11, delete "." before "A package".

Signed and Sealed this

Twelfth Day of May, 2009

JOHN DOLL
*Acting Director of the United States Patent and Trademark Office*